(12) United States Patent
Hamada et al.

(10) Patent No.: US 11,227,715 B2
(45) Date of Patent: Jan. 18, 2022

(54) ELECTRONIC COMPONENT

(71) Applicant: MURATA MANUFACTURING CO., LTD., Kyoto-fu (JP)

(72) Inventors: Akinori Hamada, Nagaokakyo (JP); Hayami Kudo, Nagaokakyo (JP); Ryo Okura, Nagaokakyo (JP); Shinji Otani, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 1482 days.

(21) Appl. No.: 15/293,700

(22) Filed: Oct. 14, 2016

(65) Prior Publication Data

US 2017/0032887 A1 Feb. 2, 2017

Related U.S. Application Data

(63) Continuation of application No. PCT/JP2015/066169, filed on Jun. 4, 2015.

(30) Foreign Application Priority Data

Jun. 4, 2014 (JP) .............................. JP2014-115854

(51) Int. Cl.
*H01F 27/29* (2006.01)
*H01F 41/04* (2006.01)
(Continued)

(52) U.S. Cl.
CPC ....... *H01F 27/292* (2013.01); *H01F 17/0013* (2013.01); *H01F 27/255* (2013.01);
(Continued)

(58) Field of Classification Search
CPC .............................. H01F 27/292; H01F 27/255
(Continued)

(56) References Cited

U.S. PATENT DOCUMENTS

2002/0158307 A1 10/2002 Honda et al.
2006/0007640 A1* 1/2006 Ishifune ................. H01G 2/065
361/523

(Continued)

FOREIGN PATENT DOCUMENTS

| CN | 1366686 A | 8/2002 |
|---|---|---|
| CN | 101268524 A | 9/2008 |

(Continued)

OTHER PUBLICATIONS

International Search Report issued in PCT/JP2015/066169; dated Aug. 18, 2015.

(Continued)

*Primary Examiner* — Tszfung J Chan
(74) *Attorney, Agent, or Firm* — Studebaker & Brackett PC

(57) ABSTRACT

An electronic component includes a main body made of an insulator, a circuit element positioned inside the main body, and outer electrodes. The outer electrodes are constituted of bottom surface electrodes and post-like electrodes. The post-like electrodes are extended from a bottom surface of the main body toward the interior of the main body. Further, the post-like electrodes are embedded in the main body, and parts of the post-like electrodes are exposed to side surfaces of the main body. Furthermore, the bottom surface electrodes are made of a resin containing metal powder.

18 Claims, 10 Drawing Sheets

(51) Int. Cl.
*H01F 17/00* (2006.01)
*H01F 27/255* (2006.01)
*H01F 41/02* (2006.01)
*H01F 41/10* (2006.01)
*H05K 3/32* (2006.01)

(52) U.S. Cl.
CPC ....... *H01F 41/0206* (2013.01); *H01F 41/041* (2013.01); *H01F 41/10* (2013.01); *H05K 3/32* (2013.01)

(58) Field of Classification Search
USPC .................................................. 336/200, 232
See application file for complete search history.

(56) References Cited

U.S. PATENT DOCUMENTS

| | | | |
|---|---|---|---|
| 2009/0134361 A1 | 5/2009 | Takashima et al. | |
| 2009/0153282 A1* | 6/2009 | Taoka | H01F 17/0013 336/200 |
| 2010/0157565 A1* | 6/2010 | Yoshida | H01F 27/292 361/811 |
| 2011/0291790 A1* | 12/2011 | Okumura | H01F 5/003 336/200 |
| 2012/0188682 A1* | 7/2012 | Sato | H01G 4/232 361/305 |
| 2013/0082575 A1* | 4/2013 | Kang | H01C 7/10 310/363 |
| 2013/0093556 A1* | 4/2013 | Lim | H01G 4/30 336/200 |
| 2013/0113594 A1* | 5/2013 | Lee | H01F 41/041 336/200 |
| 2014/0009254 A1 | 1/2014 | Ohkubo et al. | |
| 2014/0176284 A1* | 6/2014 | Lee | H01F 17/0013 336/200 |
| 2015/0035633 A1* | 2/2015 | Liu | H01F 27/292 336/92 |

FOREIGN PATENT DOCUMENTS

| | | | |
|---|---|---|---|
| JP | 08335529 A | * | 12/1996 |
| JP | H08-335529 A | | 12/1996 |
| JP | 2003031424 A | * | 1/2003 |
| JP | 2006-294722 A | | 10/2006 |
| JP | 2006294722 A | * | 10/2006 |
| JP | 2007-165477 A | | 6/2007 |
| JP | 2011-029862 A | | 2/2011 |
| JP | 2011114265 A | * | 6/2011 |
| JP | 2012-015493 A | | 1/2012 |
| JP | 2013-038392 A | | 2/2013 |
| JP | 2014-013815 A | | 1/2014 |
| WO | 01/080256 A1 | | 10/2001 |
| WO | 2007/055303 A1 | | 5/2007 |

OTHER PUBLICATIONS

Written Opinion issued in PCT/JP2015/066169; dated Aug. 18, 2015.

International Preliminary Report On Patentability issued in PCT/JP2015/066169; dated Dec. 6, 2016.

An Office Action; "Notice of Reasons for Rejection," issued by the Japanese Patent Office dated Dec. 5, 2017, which corresponds to Japanese Patent Application No. 2016-525230 and is related to U.S. Appl. No. 15/293,700.

* cited by examiner

ELECTRONIC COMPONENT

CROSS REFERENCE TO RELATED APPLICATIONS

This application claims benefit of priority to Japanese Patent Application 2014-115854 filed Jun. 4, 2014, and to International Patent Application No. PCT/JP2015/066169 filed Jun. 4, 2015, the entire content of which is incorporated herein by reference.

TECHNICAL FIELD

The present disclosure relates to electronic components and manufacturing methods therefor, and particularly relates to an electronic component including a circuit element inside an insulator and a manufacturing method for the stated electronic component.

BACKGROUND

With the advent of high-performance mobile terminals having a variety of functions, it has been considered these years to make electronic components such as inductors that are mounted in mobile terminals such as cellular phones be smaller in size and shorter in height. In order to make electronic components shorter in height, a major trend of the shape of outer electrodes of electronic components is such that the shape thereof is shifting from a square shape type with one side open, in which the outer electrode extends from an upper surface to a lower surface of the electronic component through a side surface thereof, to an L shape type, in which the outer electrode is provided only on the side surface and the lower surface of the electronic component. As a manufacturing method for such electronic component, a manufacturing method for an electronic component disclosed in Japanese Unexamined Patent Application Publication No. 2007-165477 is known. In this type of manufacturing method for an electronic component (hereinafter, referred to as "conventional electronic component manufacturing method"), a plurality of outer electrodes are provided by sputtering on a mother board where a plurality of circuit elements are integrally mounted. Thereafter, by dividing the stated mother board into a plurality of individual entities, a plurality of electronic components are simultaneously manufactured.

In the conventional electronic component manufacturing method, outer electrodes are generally thin in thickness and have high electric resistance because the outer electrodes are provided by sputtering. This makes it difficult for the outer electrode made through the conventional electronic component manufacturing method to obtain sufficient conductivity between the outer electrode and the circuit element positioned inside the electronic component.

Technical Problem

An object of the present disclosure is to provide an electronic component including an L shape-type outer electrode with low electric resistance and a manufacturing method for the stated electronic component.

Solution to Problem

An electronic component according to a first aspect of the present disclosure includes:
a main body made of an insulator;
a circuit element positioned inside the main body; and
an outer electrode that is constituted of a bottom surface electrode positioned on a bottom surface of the main body and a post-like electrode extending from the bottom surface toward the interior of the main body, and that is electrically connected to the circuit element,
wherein the post-like electrode is embedded in the main body,
part of the post-like electrode is exposed to a side surface of the main body, and
the bottom surface electrode is made of a resin containing metal powder.

A manufacturing method for an electronic component according to a second aspect of the present disclosure is a method for an electronic component having a main body that is made of an insulator whose surface is partially covered with a resin containing magnetic powder, a circuit element positioned inside the main body, and an L shape-type outer electrode connected to the circuit element, the method including:
a first process of forming a post-like electrode constituting part of the outer electrode by plating on a surface of a mother board that is constituted of assemblage of the main bodies excluding the resin containing magnetic powder and a plurality of the circuit elements;
a second process of covering the mother board provided with the post-like electrode with the resin containing magnetic powder;
a third process of exposing one end of the post-like electrode by grinding a surface of the resin containing magnetic powder;
a fourth process of applying a resin electrode constituting a remaining part of the outer electrode onto the one end of the post-like electrode that is exposed from the surface of the resin containing magnetic powder; and
a fifth process after the fourth process of dividing the mother board by cutting the mother board passing through the post-like electrode in a direction substantially parallel to an extension direction of the post-like electrode.

In the electronic component according to the first aspect of the present disclosure, the outer electrode is constituted of the bottom surface electrode positioned on the bottom surface of the main body and the post-like electrode extending from the bottom surface toward the interior of the main body. In other words, the stated outer electrode is substantially an L shape-type electrode. Since the outer electrode made through the conventional electronic component manufacturing method is made by sputtering, the stated electrode is provided only on a surface of the electronic component. Meanwhile, the post-like electrode of the electronic component according to the first aspect of the present disclosure is embedded in the electronic component, and part of the post-like electrode is exposed to a surface of the main body. As such, the post-like electrode of the electronic component according to the first aspect of the present disclosure is thicker in thickness than the outer electrode made through the conventional electronic component manufacturing method. Because of this, the outer electrode of the electronic component according to the first aspect of the present disclosure has lower resistance than the outer electrode of the electronic component made through the conventional electronic component manufacturing method.

Advantageous Effects of Disclosure

According to the present disclosure, an L shape-type outer electrode with low electric resistance can be obtained.

DETAILED DESCRIPTION (Electronic Component Configuration; See FIGS. 1-3)

An electronic component 1 according to an embodiment will be described with reference to the drawings. Hereinafter, a direction orthogonal to a bottom surface of the electronic component 1 is defined as a z-axis direction. Further, in planar view in the z-axis direction, a direction along a long side of the electronic component 1 is defined as an x-axis direction, and a direction along a short side of the electronic component 1 is defined as a y-axis direction. Note that the x-axis, y-axis, and z-axis are orthogonal to each other.

Figure 1:
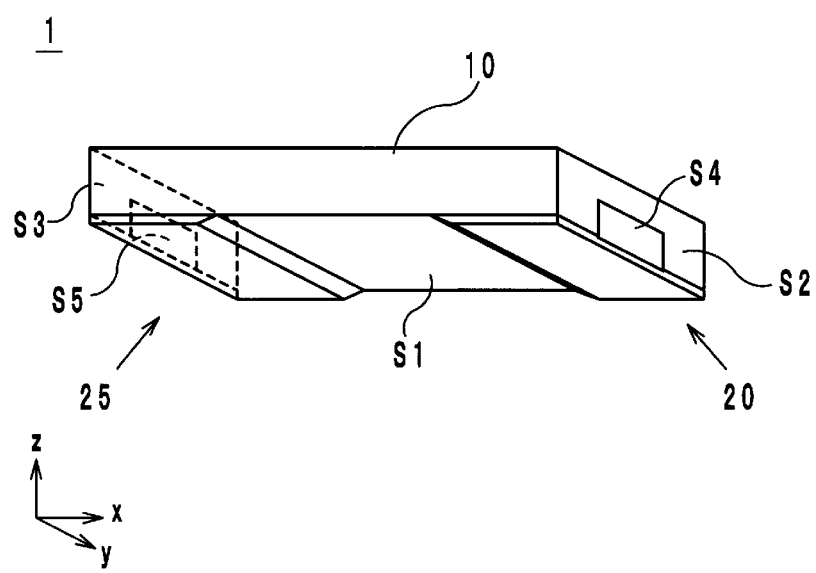
FIG. 1 is an external view of an electronic component according to an embodiment.

The electronic component 1 includes a main body 10, outer electrodes 20 and 25, and a circuit element 30. Further, the electronic component 1 is formed in a substantially rectangular parallelepiped shape as shown in FIG. 1.

Figure 2:
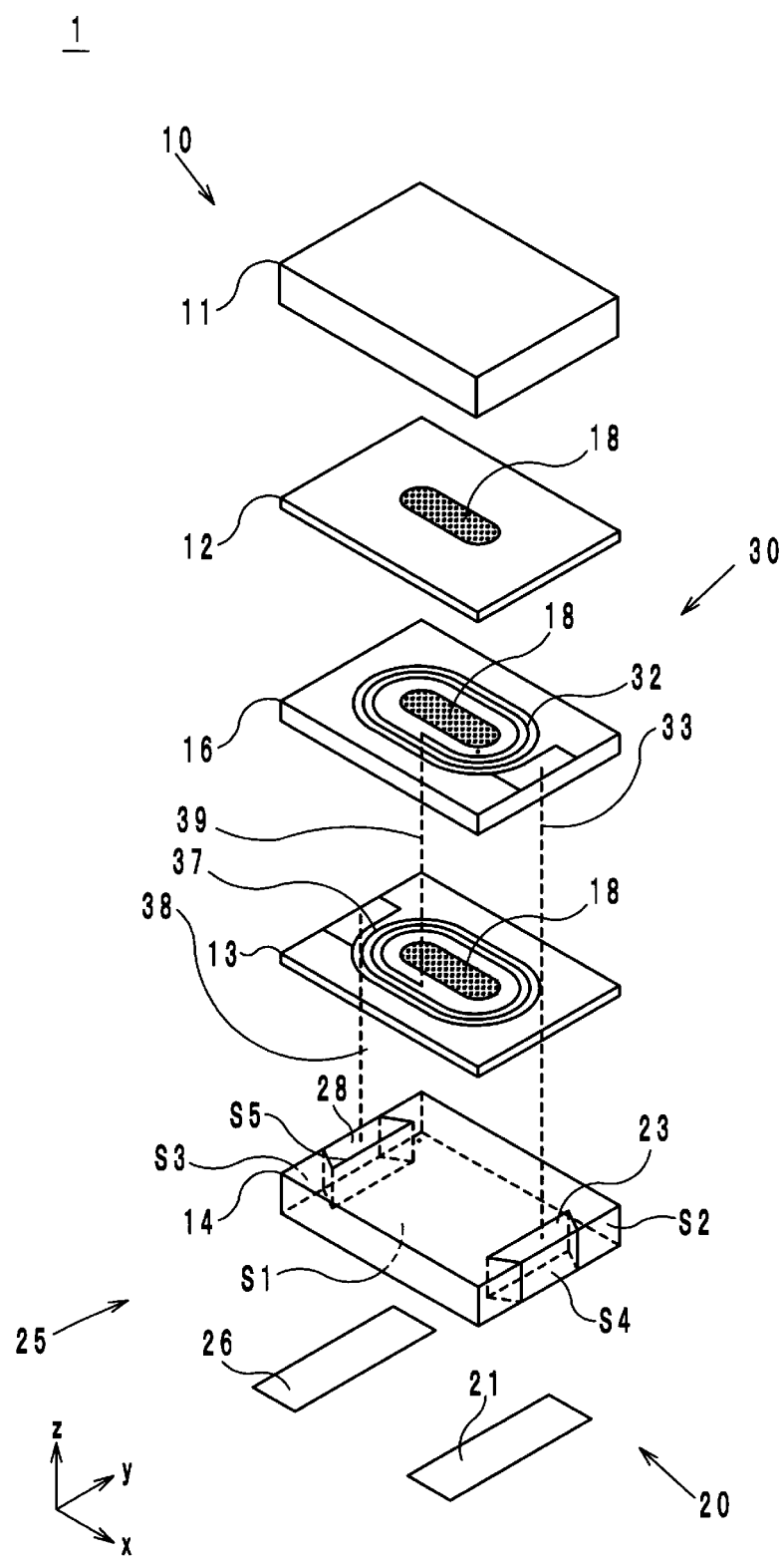
FIG. 2 is an exploded perspective view of the electronic component according to the embodiment.

As shown in FIG. 2, the main body 10 is constituted of insulator layers 11 through 14, an insulator substrate 16, and a magnetic path 18. In the main body 10, the insulator layers 11 and 12, the insulator substrate 16, and the insulator layers 13 and 14 are laminated in that order from a positive direction side toward a negative direction side of the z-axis direction.

The insulator layers 11 and 14 are formed of a resin containing magnetic powder, or the like. As the magnetic powder, ferrite, metallic magnetic materials (Fe, Si, Cr, and the like), and so on can be cited, while as the resin, a polyimide resin, an epoxy resin, and so on can be cited. Here, in the present embodiment, in consideration of an L value and direct-current superposition characteristics of the electronic component 1, an amount of equal to or more than 90 wt % of magnetic powder is contained. The insulator layer 11 is positioned at an end portion of the main body 10 on the positive direction side of the z-axis direction. The insulator layer 14 is positioned at an end portion of the electronic component 1 on the negative direction side of the z-axis direction, and a bottom surface S1 as a surface of the insulator layer 14 on the negative direction side of the z-axis direction serves as a mounting surface when the electronic component 1 is mounted on a circuit board.

The insulator layers 12 and 13 are formed with an epoxy resin or the like. The insulator layer 12 is positioned on the negative direction side of the z-axis direction relative to the insulator layer 11, and the insulator layer 13 is positioned on the positive direction side of the z-axis direction relative to the insulator layer 14. The material of the insulator layers 12 and 13 may be an insulative resin such as benzocyclobutene, an insulative inorganic material such as glass ceramics, or the like.

The insulator substrate 16 is a printed wiring substrate in which an epoxy resin is impregnated into glass cloth, and is sandwiched between the insulator layer 12 and the insulator layer 13 in the z-axis direction. The material of the insulator substrate 16 may be an insulative resin such as benzocyclobutene, an insulative inorganic material such as glass ceramics, or the like.

The magnetic path 18 is made of a resin containing magnetic powder and positioned substantially at the center of the interior of the main body 10. As the magnetic powder, ferrite, metallic magnetic materials (Fe, Si, Cr, and the like), and so on can be cited, while as the resin, a polyimide resin, an epoxy resin, and so on can be cited. In the present embodiment, in consideration of the L value and the direct-current superposition characteristics of the electronic component 1, an amount of equal to or more than 90 wt % of magnetic powder is contained. In addition, two types of powder having different grain sizes are mixed so as to increase the filling capability with respect to the magnetic path 18. The magnetic path 18 passes through the insulator layers 12 and 13 as well as the insulator substrate 16 in the z-axis direction, and is formed in a post-like shape having an oval cross-section. Further, the magnetic path 18 is so provided as to be positioned at an inner circumference side of coils 32 and 37 to be explained later.

The outer electrode 20 is, when viewed from the exterior of the main body 10, provided on the bottom surface S1 and a side surface S2 of the main body 10 on the positive direction side of the x-axis direction. Further, the outer electrode 20 is constituted of a bottom surface electrode 21 formed with a composite member of metal and resin, and a post-like electrode 23 formed with a material of Cu. As other materials that can be used for the post-like electrode 23, Au, Ag, Pd, Ni, and so on can be cited.

The bottom surface electrode 21 is what is known as a resin electrode, in which metal powder with low resistance, specifically in this embodiment, Cu powder coated with Ag and having an average grain diameter of 100 nm is dispersed in a phenol-based resin. Further, the bottom surface electrode 21 is a plate electrode that is provided in a region of the bottom surface S1 of the insulator layer 14 on the positive direction side of the x-axis direction. The bottom surface electrode 21 has a rectangular shape in planar view from the negative direction side of the z-axis direction.

Figure 3:
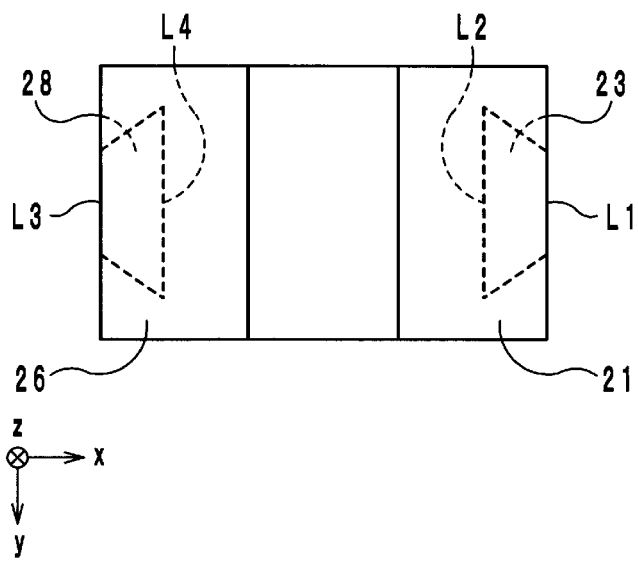
FIG. 3 is a plan view of the electronic component according to the embodiment when viewed from a bottom surface of the electronic component.

The post-like electrode 23 is basically an electrode that is provided in a region of the interior of the main body 10 on the positive direction side of the x-axis direction, and extends so as to pass through the insulator layer 14 in the z-axis direction. Note that a side surface S4 (exposed portion) of the post-like electrode 23 on the positive direction side of the x-axis direction is exposed to the side surface S2 of the main body 10. Further, as shown in FIG. 3, in planar view in the z-axis direction, the post-like electrode 23 is formed in a trapezoid shape where an outer edge L1 exposed to the side surface S2 is taken as an upper base and an outer edge L2 positioned at the innermost side of the main body 10 is taken as a lower base. The height of the trapezoid is equal to or larger than 10 μm. The outer edge L2 is longer than the outer edge L1. Further, the post-like electrode 23 is set within the bottom surface electrode 21 in planar view in the z-axis direction. In addition, an area of the side surface S4 of the post-like electrode 23 is smaller than an area of the bottom surface electrode 21. Then, as shown in FIG. 2, a surface of the post-like electrode 23 on the negative direction side of the z-axis direction (hereinafter, a "surface on the negative direction side of the z-axis direction" is referred to as a "lower surface") is in contact with a surface of the bottom surface electrode 21 on the positive direction side of the z-axis direction (hereinafter, a "surface on the positive direction side of the z-axis direction" is referred to as an "upper surface").

The outer electrode 25 is, when viewed from the exterior of the main body 10, provided on the bottom surface S1 and a side surface S3 of the main body 10 on the negative direction side of the x-axis direction. The outer electrode 25 is constituted of a bottom surface electrode 26 formed with a composite member of metal and resin, and a post-like electrode 28 formed with a material of Cu. As other materials that can be used for the post-like electrode 28, Au, Ag, Pd, Ni, and so on can be cited.

The bottom surface electrode 26 is what is known as a resin electrode, in which metal powder with low resistance, specifically in this embodiment, Cu powder coated with Ag and having an average grain diameter of 100 nm is dispersed in an organic material such as an epoxy resin, a phenol resin, or the like. Further, the bottom surface electrode 26 is a plate electrode that is provided in a region of the bottom surface S1 of the insulator layer 14 on the negative direction side of the x-axis direction. The bottom surface electrode 26 has a rectangular shape in planar view from the negative direction side of the z-axis direction.

The post-like electrode 28 is basically an electrode that is provided in a region of the interior of the main body 10 on the negative direction side of the x-axis direction, and extends so as to pass through the insulator layer 14 in the z-axis direction. Note that a side surface S5 (exposed potion) of the post-like electrode 28 on the negative direction side of the x-axis direction is exposed to the side surface S3 of the main body 10. Further, as shown in FIG. 3, in planar view in the z-axis direction, the post-like electrode 28 is formed in a trapezoid shape where an outer edge L3 exposed to the side surface S3 is taken as an upper base and an outer edge L4 positioned at the innermost side of the main body 10 is taken as a lower base. The height of the trapezoid is equal to or larger than 10 μm. The outer edge L4 is longer than the outer edge L3. Further, the post-like electrode 28 is set within the bottom surface electrode 26 in planar view in the z-axis direction. In addition, an area of the side surface S5 of the post-like electrode 28 is smaller than an area of the bottom surface electrode 26. Then, as shown in FIG. 2, a lower surface of the post-like electrode 28 is in contact with an upper surface of the bottom surface electrode 26.

The circuit element 30 is positioned inside the main body 10, and is formed with a conductive material such as Au, Ag, Cu, Pd, Ni, or the like. The circuit element 30 is constituted of a coil 32, a via conductor 33, a coil 37, and via conductors 38, 39.

The coil 32 is provided on an upper surface of the insulator substrate 16, and is a spiral linear conductor revolving clockwise so as to gradually approach the center in planar view from the positive direction side of the z-axis direction. One end of the coil 32 on an outer circumference side extends toward the side surface S2 of the main body 10. An area of a cross-section of the coil 32 orthogonal to the revolving direction thereof is smaller than an area of a cross-section of the post-like electrodes 23 and 28 orthogonal to the z-axis direction as their extension direction.

The via conductor 33 connects the one end of the coil 32 on the outer circumference side to the post-like electrode 23. As such, the via electrode 33 passes through the insulator substrate 16 and the insulator layer 13 in the z-axis direction.

The coil 37 is provided on a lower surface of the insulator substrate 16, in other words, on an upper surface of the insulator layer 13, and is a spiral linear conductor revolving clockwise to be gradually distanced from the center toward an outer side portion in planar view from the positive direction side of the z-axis direction. One end of the coil 37 on an outer circumference side extends toward the side surface S3 of the main body 10. In addition, the other end of coil 37 on an inner circumference side is so provided as to overlap with the other end of the coil 32 on the inner circumference side when viewed in the z-axis direction. Note that an area of a cross-section of the coil 37 orthogonal to the revolving direction thereof is smaller than an area of a cross-section of the post-like electrodes 23 and 28 orthogonal to the z-axis direction as their extension direction.

The via conductor 38 connects the one end of the coil 37 on the outer circumference side to the post-like electrode 28. As such, the via electrode 38 passes through the insulator layer 13 in the z-axis direction.

The via conductor 39 passes through the insulator substrate 16 in the z-axis direction and connects the other end of the coil 32 on the inner circumference side to the other end of the coil 37 on the inner circumference side.

The electronic component 1 constituted as discussed above functions as an inductor in the case where a signal inputted from the outer electrode 20 or outer electrode 25 is outputted from the outer electrode 25 or outer electrode 20 via the circuit element 30.

(Manufacturing Method; See FIGS. 4-16)

Hereinafter, a manufacturing method for the electronic component 1 according to the embodiment will be described. Note that the z-axis direction referred to in the description of the manufacturing method is a direction orthogonal to the bottom surface of the electronic component 1, which is manufactured by the manufacturing method.

Figure 4:
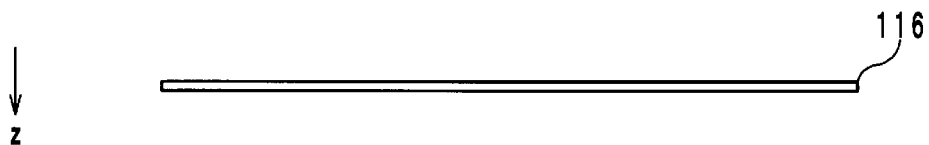
FIG. 4 is a diagram illustrating a manufacturing process of the electronic component according to the embodiment.
Figure 5:
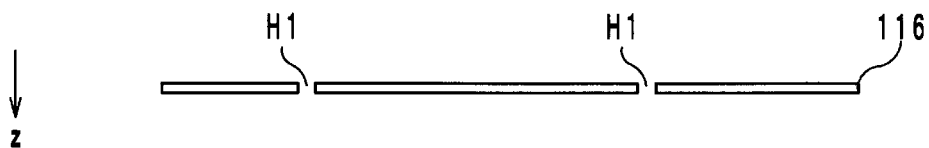
FIG. 5 is a diagram illustrating a manufacturing process of the electronic component according to the embodiment.

First, as shown in FIG. 4, a mother insulator board 116 to become a plurality of insulator substrates 16 is prepared. Then, as shown in FIG. 5, a plurality of through-holes H1 for providing the via conductors 39 are formed in the mother insulator board 116 by laser processing or the like.

Figure 6:
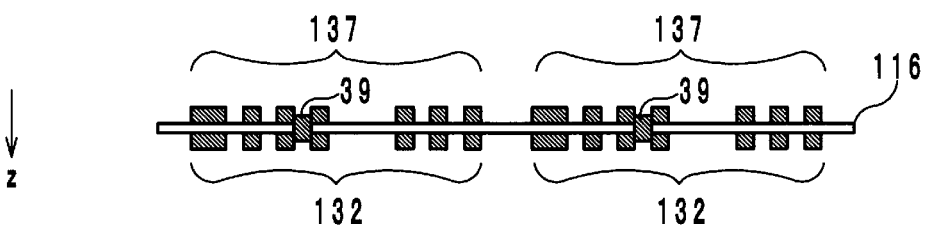
FIG. 6 is a diagram illustrating a manufacturing process of the electronic component according to the embodiment.

Next, as shown in FIG. 6, Cu plating is applied to an upper surface and a lower surface of the mother insulator board 116 in which the plurality of through-holes have been formed, and the interior of each through-hole is also plated, whereby the plurality of via conductors 39 are provided. Thereafter, a plurality of conductor patterns 132 and conductor patterns 137 corresponding to the coils 32 and the coils 37 are formed on the upper surface and the lower surface of the mother insulator board 116 by photolithography.

Figure 7:
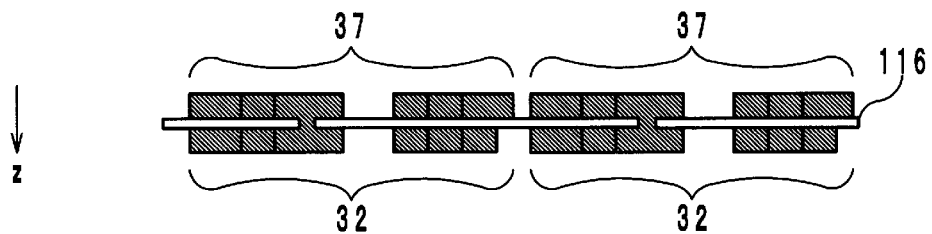
FIG. 7 is a diagram illustrating a manufacturing process of the electronic component according to the embodiment.

After having formed the plurality of conductor patterns 132 and conductor patterns 137, the Cu plating is further applied so as to obtain the plurality of coils 32 and coils 37 having sufficient thicknesses as shown in FIG. 7.

Figure 8:
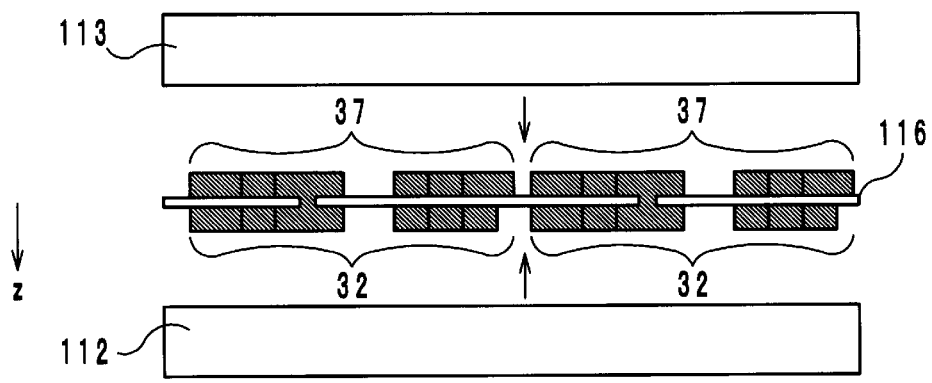
FIG. 8 is a diagram illustrating a manufacturing process of the electronic component according to the embodiment.

Subsequently, as shown in FIG. 8, the mother insulator board 116 where the plurality of coils 32 and coils 37 have been formed is sandwiched in the z-axis direction between insulator sheets 112 and 113 that become the plurality of insulator layers 12 and insulator layers 13.

Figure 9:
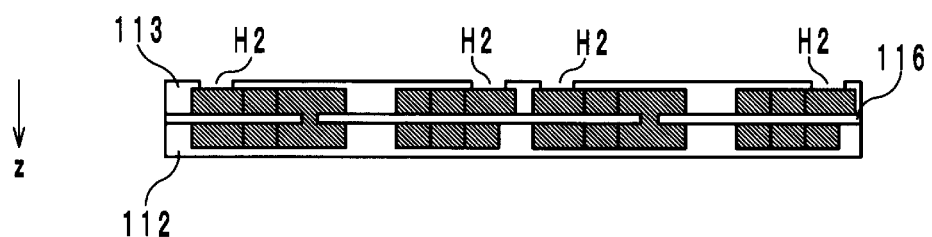
FIG. 9 is a diagram illustrating a manufacturing process of the electronic component according to the embodiment.

Next, as shown in FIG. 9, a plurality of through-holes H2 for providing the via conductors 33 and 38 are formed in the insulator sheets 112 and 113 by laser processing or the like. Further, in order to remove smears generated due to the formation of the through-holes, desmear processing is carried out.

After the desmear processing, electroless Cu plating is applied to the insulator sheet 113 first. The aim of this electroless plating is to form a seed layer for electrolytic Cu plating to be carried out thereafter. After having formed the seed layer, the electrolytic Cu plating is applied to the insulator sheet 113. With this, a surface of the insulator sheet 113 and the interior of each through-hole are plated, whereby the plurality of via conductors 33 and via conductors 38 are provided.

Figure 10:
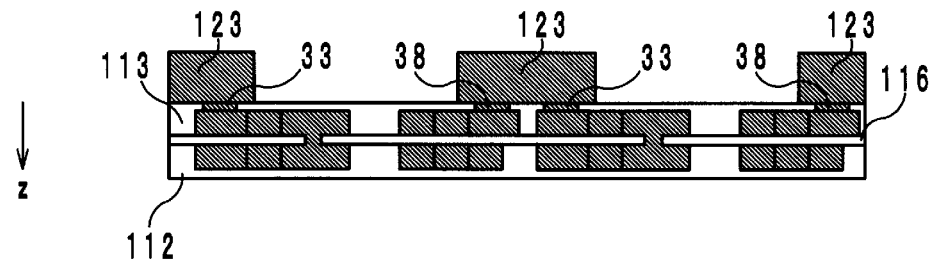
FIG. 10 is a diagram illustrating a manufacturing process of the electronic component according to the embodiment.
Figure 11:
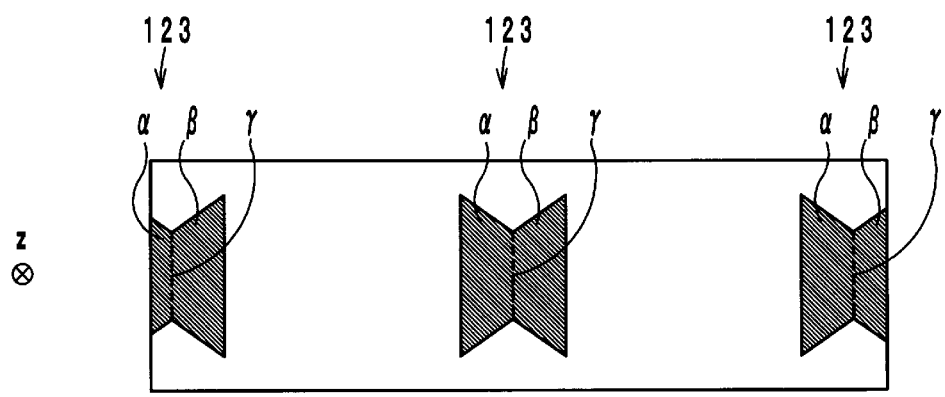
FIG. 11 is a plan view of a post-like electrode in a manufacturing stage when viewed from a bottom surface of the post-like electrode.

Thereafter, as shown in FIG. 10, a plurality of sufficiently thick conductor patterns 123 corresponding to the post-like electrodes 23 and 28 are formed on the insulator sheet 113 by photolithography and Cu plating. Here, as shown in FIG. 11, a single conductor pattern 123 is, when viewed in the z-axis direction, formed in a shape such that two trapezoids α and β being line-symmetric are connected at the upper bases thereof each serving as their symmetry axis γ.

Figure 12:
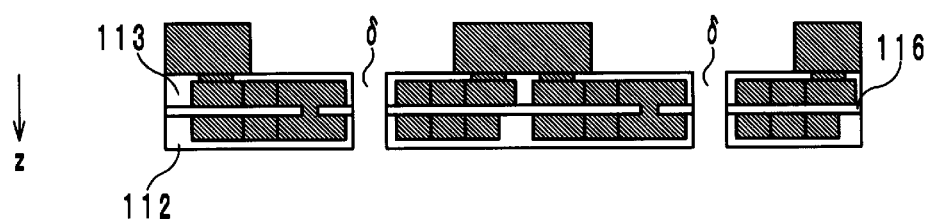
FIG. 12 is a diagram illustrating a manufacturing process of the electronic component according to the embodiment.

Next, in order to provide the magnetic path 18, a plurality of through-holes δ passing through the mother insulator board 116 and the insulator sheets 112, 113 in the z-axis direction are formed by laser processing or the like, as shown in FIG. 12. The positions at which the through-holes δ are formed are set on the inner circumference side of the plurality of coils 32 and coils 37 provided on the mother insulator board 116 in an x-y plane.

Figure 13:
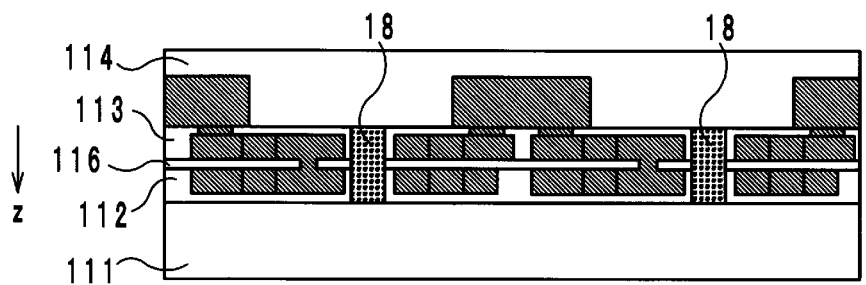
FIG. 13 is a diagram illustrating a manufacturing process of the electronic component according to the embodiment.

Then, as shown in FIG. 13, a multilayer body in which the insulator sheet 112, the mother insulator board 116, and the insulator sheet 113 are laminated in that order is sandwiched in the z-axis direction between resin sheets 111 and 114 containing metallic magnetic powder and corresponding to the insulator layers 11 and 14 to carry out pressure bonding. In this case, the resin sheet 111 containing metallic magnetic powder is pressure-bonded from the insulator sheet 112 side, while the resin sheet 114 containing metallic magnetic powder is pressure-bonded from the insulator sheet 113 side. With the above pressure bonding, the resin sheets 111 and 114 containing metallic magnetic powder are inserted into the plurality of through-holes δ, whereby a plurality of magnetic paths 18 are provided. Thereafter, the resin sheets are cured by heat treatment using a temperature controlled bath such as an oven or the like.

Figure 14:
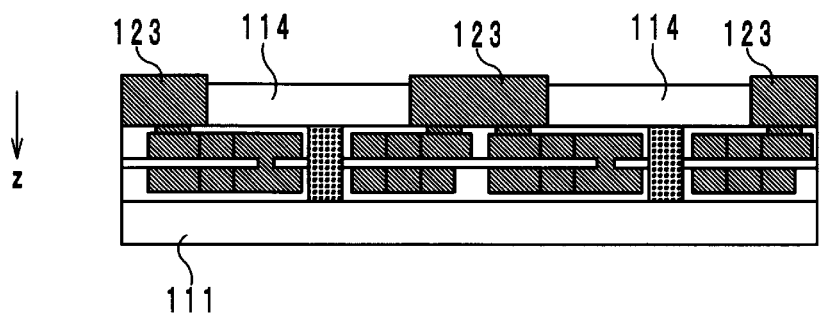
FIG. 14 is a diagram illustrating a manufacturing process of the electronic component according to the embodiment.

Next, a surface of the resin sheet 114 is ground by buffing, lap polishing, grinder grinding, or the like. With this, as shown in FIG. 14, the conductor patterns 123 are exposed in the surface of the resin sheet 114. At the time of grinding the resin sheet 114, a surface of the resin sheet 111 may be ground for thickness adjustment.

Figure 15:
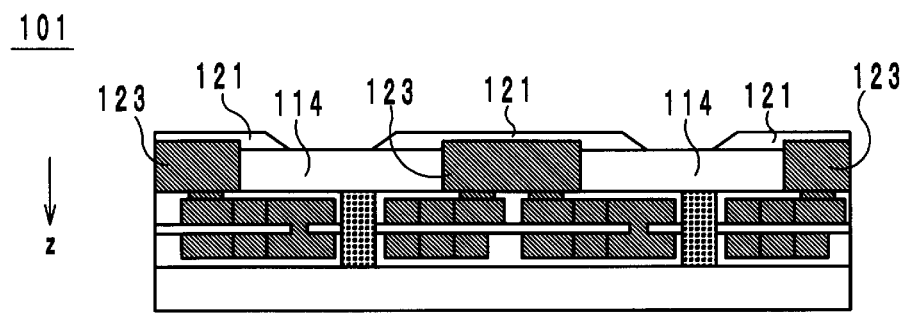
FIG. 15 is a diagram illustrating a manufacturing process of the electronic component according to the embodiment.

A phenol-based resin in which Cu powder coated with Ag and having an average grain diameter of 100 nm is dispersed is applied by screen printing to the conductor patterns 123 exposed in the surface of the resin sheet 114 and is then dried, whereby a plurality of resin electrode patterns 121 corresponding to the bottom surface electrodes 21 and 26 are provided on the surface of the resin sheet 114 as shown in FIG. 15. With this, a mother board 101 which is an assemblage of a plurality of electronic components 1 is completed.

Figure 16:
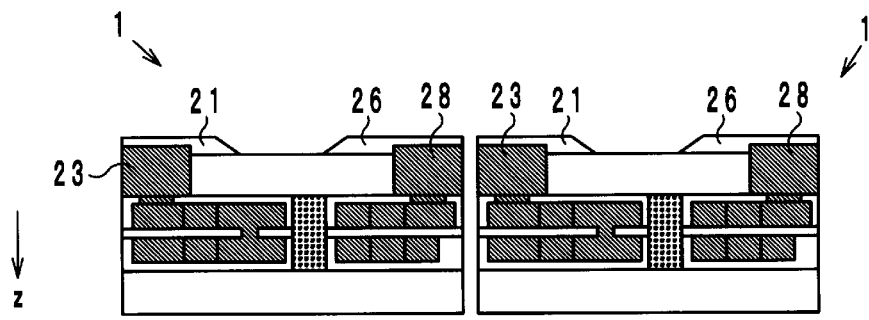
FIG. 16 is a diagram illustrating a manufacturing process of the electronic component according to the embodiment.

Finally, the mother board 101 is divided into the plurality of electronic components 1. Specifically, the mother board 101 is cut with a dicer or the like so that the symmetry axis γ, which is illustrated in FIG. 11 and is positioned at the center of each of the conductor patterns 123, overlaps with a cut line, whereby the mother board 101 is divided into the plurality of electronic components 1 as shown in FIG. 16. In this case, the conductor pattern 123 is divided, taking the symmetry axis γ as the center for cutting, into two sections, and these sections become the post-like electrodes 23 and 28, respectively. In addition, the resin electrode pattern 121 is also divided to become the bottom surface electrodes 21 and 26. Thus, the plurality of electronic components 1, each of which is shown in FIG. 1, are completed. After having divided into the plurality of electronic components 1, nickel plating and tin plating may be applied to the surfaces of the outer electrodes 20 and 25 in order to improve solder wettability of the outer electrodes 20 and 25.

Figure 17:
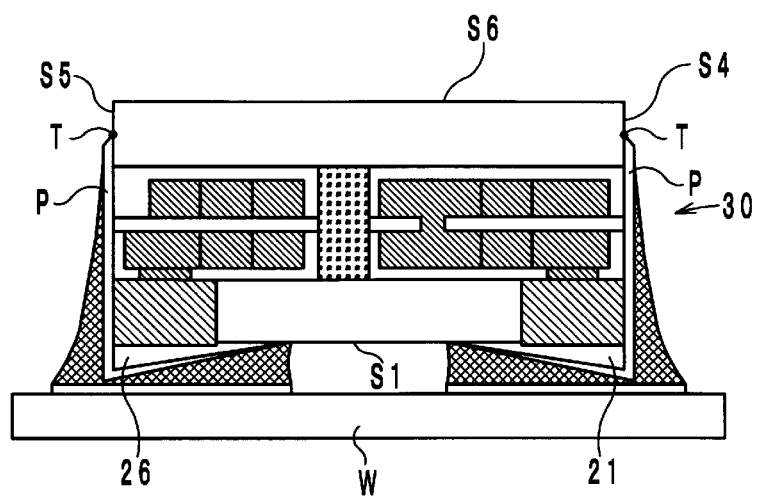
FIG. 17 is a cross-sectional view of an electronic component in which part of the electronic component according to the embodiment is modified.

Prior to the application of nickel plating and tin plating, plating P formed with the same material as that of the circuit element 30 may be applied to the side surfaces S4 and S5 of the main body as well as the surfaces of the bottom surface electrodes 21 and 26. In this case, as shown in FIG. 17, the plating P applied to the side surfaces S4 and S5 extends from the bottom surface S1 toward a top surface S6 of the main body 10 positioned on the positive direction side of the z-axis direction. In addition, tips T of the plating P applied to the side surfaces S4 and S5 are positioned on the positive direction side of the z-axis direction, in other words, on the top surface S6 side in the z-axis direction in comparison with the circuit element 30.

Further, after the resin electrode patterns 121 have been provided on the surface of the resin sheet 114 and before the mother board 101 is divided into the plurality of electronic components 1, the resin electrode patterns 121 may be thermally cured. This thermal cure causes organic materials in the resin electrode patterns 121 to bleed. As a result, when the mother board 101 is divided into the plurality of electronic components 1, the bottom surface electrodes 21 and 26 each thickness of which becomes thinner in the z-axis direction as it progresses from the side surface S4 and side surface S5 sides of the main body 10 toward the inner side thereof, as shown in FIG. 17, can be made.

(Effects)

In the electronic component 1 according to the embodiment, the outer electrodes 20 and 25 are constituted of the bottom surface electrodes 21, 26 that are provided on the bottom surface S1 parallel to the x-y plane of the main body 10 and the post-like electrodes 23, 28 that extend in the z-axis direction. In other words, the outer electrodes 20 and 25 are L shape-type electrodes. The post-like electrodes 23 and 28 are embedded in the electronic component 1, and part thereof are respectively exposed to the side surfaces S2 and S3 of the electronic component 1. Accordingly, unlike the outer electrode made by sputtering in the conventional electronic component manufacturing method, the outer electrodes 20 and 25 are not thin. Because of this, the outer electrodes 20 and 25 of the electronic component 1 according to the embodiment have lower resistance than the outer electrode of the electronic component made by the conventional electronic component manufacturing method.

Further, the post-like electrodes 23 and 28 are formed in a trapezoid shape when viewed in the z-axis direction. With this, the post-like electrodes 23 and 28 are unlikely to be detached from the main body 10 in the case where a force from the interior toward the side surfaces S2, S3 of the main body 10 is applied thereto.

Furthermore, an area of a cross-section of the coils 32 and 37 orthogonal to the revolving direction thereof is smaller than an area of a cross-section of the post-like electrodes 23 and 28 orthogonal to the z-axis direction as their extension direction. In other words, the area of the cross-section of the post-like electrodes 23 and 28 orthogonal to the z-axis direction as their extension direction is larger than the area of the cross-section of the coils 32 and 37 orthogonal to the revolving direction thereof. Accordingly, in the electronic component 1, resistance values of the post-like electrodes 23 and 28 are low in comparison with a case in which an area of a cross-section of the post-like electrodes 23 and 28 orthogonal to the z-axis direction as their extension direction is smaller than an area of a cross-section of the coils 32 and 37 orthogonal to the revolving direction thereof.

Note that in the electronic component 1, as a material of the bottom surface electrodes 21 and 26, used is what is known as a resin electrode in which metal powder with low resistance, that is, Cu powder coated with Ag and having an average grain diameter of 100 nm is dispersed in an organic material such as an epoxy resin, a phenol resin, or the like. This makes the bottom surface electrodes 21 and 26 more flexible than the electrode formed with only metal. Accordingly, in the case where the electronic component 1 is bent, the bottom surface electrodes 21 and 26 will not be easily broken in comparison with the electrode formed with only metal.

In addition to this, in the electronic component 1, Cu is used as a material of the post-like electrodes 23 and 28, and a resin electrode in which Cu powder coated with Ag and having an average grain diameter of 100 nm is dispersed is used as a material of the bottom surface electrodes 21 and 26. In other words, since both the bottom surface electrodes 21, 26 and the post-like electrodes 23, 28 use Cu as the material thereof, connection reliability of the bottom surface electrodes 21, 26 and the post-like electrodes 23, 28 is higher than that of a case in which different materials are used.

Further, as shown in FIG. 3, the post-like electrodes 23 and 28 are set within the bottom surface electrodes 21 and 26 in planar view in the z-axis direction. As such, the entire region of each of the lower surfaces of the post-like electrodes and 28 makes contact with the bottom surface electrodes 21 and 26, whereby the connection reliability between the bottom surface electrodes 21, 26 and the post-like electrodes 23, 28 is ensured in the electronic component 1.

In the case where a resin containing metallic magnetic powder is used like in the electronic component 1, when processing such as cutting or the like is carried out, part of the metallic magnetic powder on the processed surface is detached to generate tiny recesses on the surface of the main body 10. In the case where the outer electrode is formed by sputtering like in the conventional electronic component, it is difficult to fill the above recesses. As such, forming the outer electrode by sputtering arrests the lowering of resistance of the outer electrode. However, in the manufacturing method for the electronic component 1, plating instead of sputtering is used in the formation of the post-like electrodes 23 and 28 constituting the outer electrodes 20 and 25, respectively, and a resin electrode is applied in the formation of the bottom surface electrodes 21 and 26. With this outer-electrode formation method, even if recesses are generated due to the detachment of the metallic magnetic powder like in the conventional electronic component, those recesses can be filled. This makes it possible to provide an electronic component including a low-resistance outer electrode.

Further, in the manufacture of the electronic component 1, in the case where the plating P, whose tips T are positioned on the positive direction side of the z-axis direction in comparison with the circuit element 30 as shown in FIG. 17, is applied to the side surfaces S4 and S5 of the main body and the bottom surface electrodes 21 and 26, fillets of solder used for connecting the electronic component 1 to a substrate when the electronic component 1 is mounted on the substrate are formed up to an upper layer (the top surface S6) in comparison with the circuit element 30 in the electronic component 1. This makes it possible to achieve a sufficient connection reliability between the electronic component 1 and a terminal of a substrate W on which the electronic component 1 is mounted. In addition, since the plating P is so formed as to cover the insulator substrate 16 and the insulator layer boundary surface, the concentration of stress against the insulator substrate 16 where the circuit element 30 is provided is removed. This makes it possible to suppress delamination between the insulator substrate and the insulator layer, between the insulator layers, and so on. In addition, the plating P can be applied to a surface of the bottom surface electrodes 21 and 26 and the side surface of the main body 10 to which the post-like electrode 23 is exposed such that the thickness of the plating P in the direction orthogonal to the bottom surface becomes thinner as it processes from the side surface side of the main body 10 toward the inner side of the main body 10, as shown in FIG. 17.

Moreover, in the case where, by thermally curing the resin electrode patterns 121, the bottom surface electrodes 21 and 26 each thickness of which becomes thinner in the z-axis direction as it progresses from the side surface S4 and side surface S5 sides of the main body 10 toward the inner side thereof, as shown in FIG. 17, when the mother board 101 is divided into the plurality of electronic components 1, are manufactured, mounting surfaces of the bottom surface electrodes 21 and 26 are slanted relative to the bottom surface S1 of the main body 10. With this, the resin electrode formed between the plating P and the main body 10 buffers the stress, thereby making it possible to alleviate the concentration of stress against the main body 10. Moreover, due to an increase in a contact area between the terminal and the solder and an anchor effect with respect to the solder, close-contact capability of the bottom surface electrodes 21 and 26 with respect to the terminal of the substrate W can be enhanced.

(Variation; See FIGS. 18-20)

Major differences between an electronic component 1A according to a variation and the electronic component 1 according to the embodiment are the number of outer electrodes, the configuration of the circuit element, and the function of the electronic component. Specific descriptions thereof will be given below.

Figure 18:
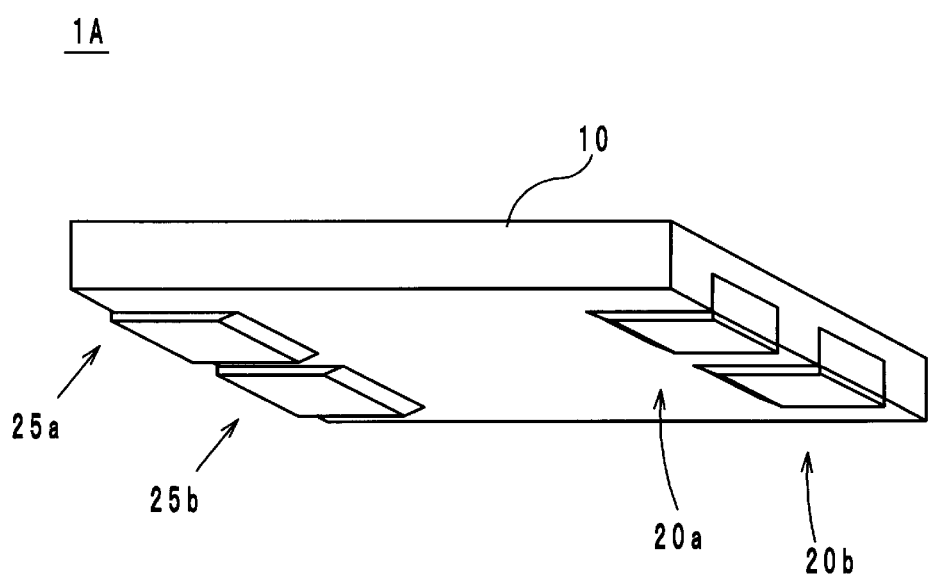
FIG. 18 is an external view of an electronic component according to a variation.
Figure 19:
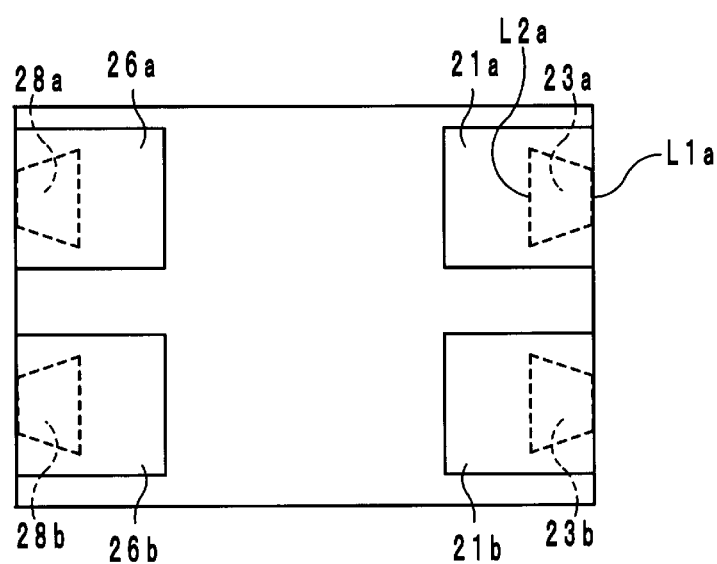
FIG. 19 is a plan view of the electronic component according to the variation when viewed from a bottom surface of the electronic component.

In the electronic component 1A, as shown in FIG. 18, the outer electrodes 20 and 25 are respectively divided into two sections in the y-axis direction, so as to provide four outer electrodes 20a, 20b, 25a, and 25b in total. Further, as shown in FIG. 19, a post-like electrode 23a included in the outer electrode 20a has a trapezoid shape in planar view in the z-axis direction where an outer edge L1a exposed to the side surface S2 is taken as an upper base and an outer edge positioned at the innermost side of the main body 10 is taken as a lower base L2a. The lower base L2a is longer than the upper base L1a. The same is applied to post-like electrodes 23b, 28a, and 28b included in the other outer electrodes 20b, 25a, and 25b.

Figure 20:
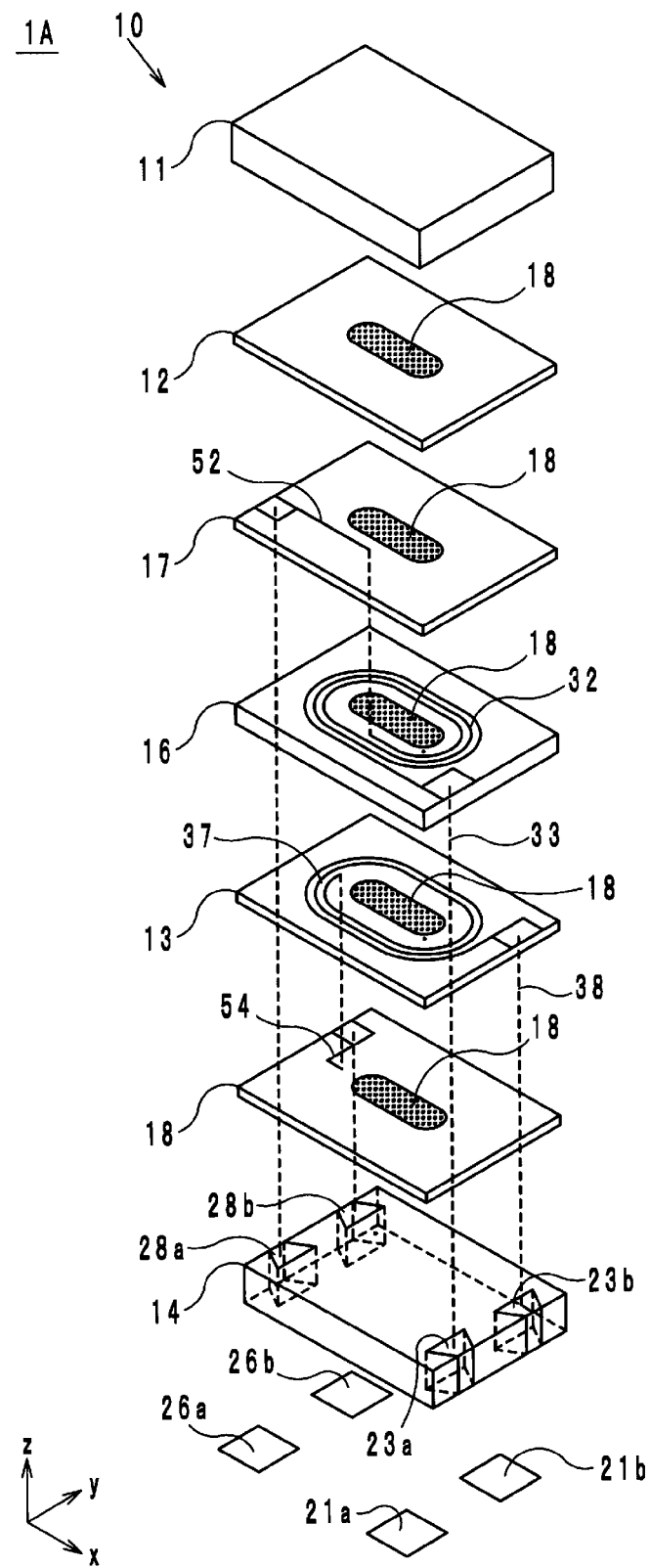
FIG. 20 is an exploded perspective view of the electronic component according to the variation.

In the electronic component 1A, as shown in FIG. 20, the coil 32 and the coil 37 are not connected to each other. Further, in the electronic component 1A, one end of the coil 32 is connected, through the via conductor 33, to the post-like electrode 23a constituting the outer electrode 20a. The other end of the coil 32 is connected, through a connecting conductor 52, to the post-like electrode 28a constituting the outer electrode 25a. Here, the connecting conductor 52 is constituted of an extended conductor provided on an insulator layer 17 having been added to the lower surface of the insulator layer 12, a via conductor passing through the insulator layer 17, and a via conductor passing through the insulator layers 13 and 17, an insulator layer 18, and the insulator substrate 16.

In addition to this, in the electronic component 1, one end of the coil 37 is connected, through the via conductor 38, to the post-like electrode 23b constituting the outer electrode 20b. The other end of the coil 37 is connected, through a connecting conductor 54, to the post-like electrode 28b constituting the outer electrode 25b. Here, the connecting conductor 54 is constituted of an extended conductor provided on the insulator layer 18 having been added to the lower surface of the insulator layer 13, a via conductor passing through the insulator layer 13, and a via conductor passing through the insulator layers 18.

In the electronic component 1A constituted as discussed above, the coils 32 and 37 overlap with each other in planer view in the z-axis direction. With this, magnetic flux generated in the coil 32 when a current flows in the coil 32 passes through the coil 37. Meanwhile, magnetic flux generated in the coil 37 when a current flows in the coil 37 passes through the coil 32. As such, in the case where the currents flows in the coil 32 and the coil 37, the coil 32 and the coil 37 are electromagnetically coupled so that the electronic component 1A functions as a common mode choke coil.

Other constituent elements, effects, and so on of the electronic component 1A according to the variation are the same as those of the electronic component 1.

Other Embodiments

The electronic component and the manufacturing method therefor according to the present disclosure are not limited to the above-described embodiment, and can be modified in various ways within the scope of the disclosure. For example, the shapes, positions, and the like of the post-like electrodes, bottom surface electrodes, and so on can be arbitrarily determined. Further, the plating applied to the side surfaces S4 and S5 of the main body and the surfaces of the bottom surface electrodes 20 and 25 can be arbitrarily selected from the plating of Cu, Ag, Au, and the like. However, it is preferable that a material of the plating and a material of the circuit element 30 be the same one in consideration of the connection reliability with respect to the circuit element 30. Furthermore, the configurations of different embodiments may be combined.

INDUSTRIAL APPLICABILITY

As discussed thus far, the present disclosure is useful for electronic components and manufacturing methods for the electronic components, and is excellent in that an L shape-type outer electrode having low electric resistance can be obtained.

The invention claimed is:

1. An electronic component comprising:
a main body made of an insulator;
a circuit element positioned inside the main body; and
an outer electrode that is constituted of a bottom surface electrode positioned on a bottom surface of the main body and a post-like electrode extending from the bottom surface toward an interior of the main body, and that is electrically connected to the circuit element, a thickness of the bottom surface electrode in a direction orthogonal to the bottom surface becoming thinner as the bottom surface electrode progresses from a side surface side of the main body toward an inner side of the main body,
wherein the post-like electrode is embedded in the main body,
part of the post-like electrode is exposed to the side surface of the main body,
the bottom surface electrode is made of a resin containing metal powder,
a plating is applied to a surface of the bottom surface electrode and the side surface of the main body to which the post-like electrode is exposed, the plating extending from the bottom surface electrode to an uppermost tip formed on the side surface of the main body, the uppermost tip being lower than a top surface of the main body in side view, and
the thickness of the bottom surface electrode in the direction orthogonal to the bottom surface becoming thinner as the bottom surface electrode progresses from the side surface side of the main body toward the inner side of the main body increases a contact area between the bottom surface of the bottom surface electrode and solder of a terminal of a substrate when the electronic component is mounted on the substrate.

2. The electronic component according to claim 1, wherein, when viewed in a direction orthogonal to the bottom surface, a length of an exposed portion of the post-like electrode, which is exposed to the side surface of the main body, is shorter than a longest length of an embedded portion of the post-like electrode, which is embedded in the main body, in a direction parallel to the side surface.

3. The electronic component according to claim 1, wherein, when viewed in a direction orthogonal to the bottom surface, a length of the post- like electrode in a direction parallel to the side surface becomes longer as the post-like electrode progresses from the side surface toward the interior of the main body.

4. The electronic component according to claim 1, wherein an area of the bottom surface electrode when viewed in a direction orthogonal to the bottom surface is larger than an area of an exposed portion of the post-like electrode, which is exposed to the side surface of the main body.

5. The electronic component according to claim 1, wherein, when viewed in a direction orthogonal to the bottom surface, a length of the bottom surface electrode is longer than a length of the post-like electrode in a direction from the side surface of the main body toward the interior of the main body.

6. The electronic component according to claim 1, wherein, when viewed in a direction orthogonal to the bottom surface, the post-like electrode is positioned within the bottom surface electrode.

7. The electronic component according to claim 1, wherein an area of a cross-section of the post-like electrode in parallel to the bottom surface is larger than an area of a cross-section of a conductor constituting the circuit element, the cross-section of the conductor being orthogonal to an extension direction of the conductor.

8. The electronic component according to claim 1, wherein the main body includes a resin containing metallic magnetic powder.

9. An electronic component comprising:
a main body made of an insulator;
a circuit element positioned inside the main body; and
an outer electrode that is constituted of a bottom surface electrode positioned on a bottom surface of the main body and a post-like electrode extending from the bottom surface toward an interior of the main body, and that is electrically connected to the circuit element, a thickness of the bottom surface electrode in a direction orthogonal to the bottom surface becoming thinner as the bottom surface electrode progresses from a side surface side of the main body toward an inner side of the main body,
wherein the post-like electrode is embedded in the main body,
part of the post-like electrode is exposed to the side surface of the main body,
the bottom surface electrode is made of a resin containing metal powder, and
a plating is applied to a surface of the bottom surface electrode and the side surface of the main body to which the post-like electrode is exposed, the thickness of the plating in the direction orthogonal to the bottom surface becoming thinner as the plating progresses from the side surface side of the main body toward the inner side of the main body.

10. The electronic component according to claim 9, wherein, when viewed in a direction orthogonal to the bottom surface, a length of an exposed portion of the post-like electrode, which is exposed to the side surface of the main body, is shorter than a longest length of an embedded portion of the post-like electrode, which is embedded in the main body, in a direction parallel to the side surface.

11. The electronic component according to claim 9, wherein, when viewed in a direction orthogonal to the bottom surface, a length of the post-like electrode in a direction parallel to the side surface becomes longer as the post-like electrode progresses from the side surface toward the interior of the main body.

12. The electronic component according to claim 9, wherein an area of the bottom surface electrode when viewed in a direction orthogonal to the bottom surface is larger than an area of an exposed portion of the post-like electrode, which is exposed to the side surface of the main body.

13. The electronic component according to claim 9, wherein, when viewed in a direction orthogonal to the bottom surface, a length of the bottom surface electrode is longer than a length of the post-like electrode in a direction from the side surface of the main body toward the interior of the main body.

14. The electronic component according to claim 9, wherein, when viewed in a direction orthogonal to the bottom surface, the post-like electrode is positioned within the bottom surface electrode.

15. The electronic component according to claim 9, wherein an area of a cross-section of the post-like electrode in parallel to the bottom surface is larger than an area of a cross-section of a conductor constituting the circuit element, the cross-section of the conductor being orthogonal to an extension direction of the conductor.

16. The electronic component according to claim 9, wherein the main body includes a resin containing metallic magnetic powder.

17. The electronic component according to claim 9, wherein the plating extends from a bottom surface of the bottom surface electrode to at least an upper side of the circuit element.

18. The electronic component according to claim 9, wherein the thickness of the bottom surface electrode in the direction orthogonal to the bottom surface becoming thinner as the bottom surface electrode progresses from the side surface side of the main body toward the inner side of the main body increases a contact area between the bottom surface of the bottom surface electrode and solder of a terminal of a substrate when the electronic component is mounted on the substrate.

* * * * *